(12) United States Patent
Honda et al.

(10) Patent No.: US 10,539,430 B2
(45) Date of Patent: Jan. 21, 2020

(54) POSITION DETECTING DEVICE

(71) Applicant: DENSO CORPORATION, Kariya, Aichi-pref. (JP)

(72) Inventors: Hitomi Honda, Kariya (JP); Yoshiyuki Kono, Kariya (JP); Hirofumi Hagio, Kariya (JP)

(73) Assignee: DENSO CORPORATION, Kariya (JP)

( * ) Notice: Subject to any disclaimer, the term of this patent is extended or adjusted under 35 U.S.C. 154(b) by 5 days.

(21) Appl. No.: 16/067,654

(22) PCT Filed: Dec. 16, 2016

(86) PCT No.: PCT/JP2016/087501
§ 371 (c)(1),
(2) Date: Jul. 2, 2018

(87) PCT Pub. No.: WO2017/126262
PCT Pub. Date: Jul. 27, 2017

(65) Prior Publication Data
US 2019/0011286 A1 Jan. 10, 2019

(30) Foreign Application Priority Data
Jan. 21, 2016 (JP) .................................. 2016-009523

(51) Int. Cl.
*G01B 7/30* (2006.01)
*G01D 5/14* (2006.01)
(Continued)

(52) U.S. Cl.
CPC ............. *G01D 5/145* (2013.01); *G01B 7/003* (2013.01); *G01B 7/14* (2013.01); *G01B 7/30* (2013.01); *G01B 11/026* (2013.01); *G01D 5/12* (2013.01); *G01D 5/14* (2013.01); *G01D 11/245* (2013.01); *G01R 33/0023* (2013.01); *G01R 33/0052* (2013.01); *G01R 33/09* (2013.01)

(58) Field of Classification Search
CPC ........... G01D 5/145; G01D 5/14; G01D 5/12; G01D 11/245; G01B 7/30; G01B 7/003; G01B 7/14; G01B 11/026; G01R 33/09; G01R 33/0023; G01R 33/0052
USPC ........... 324/51, 55, 178, 200, 207.11, 207.25
See application file for complete search history.

(56) References Cited

U.S. PATENT DOCUMENTS

2004/0018907 A1* 1/2004 Tsuzuki ................. F16H 59/08
475/132
2012/0260763 A1* 10/2012 Terao ....................... G05G 1/08
74/507

(Continued)

*Primary Examiner* — Raul J Rios Russo
(74) *Attorney, Agent, or Firm* — Nixon & Vanderhye P.C.

(57) ABSTRACT

A sensor of a position detecting device includes a sensor body, a magnetic detector, and at least one engagement protrusion that extends from a position in the vicinity of the magnetic detector. The engagement protrusion engages with an engagement hole disposed on a casing. An anti-rotation hole is disposed on the casing in a position spaced apart from the engagement hole. An anti-rotation pin is disposed on the sensor body, and engages with the anti-rotation hole to prevent the casing and the sensor body from rotating relatively to each other about the engagement hole. At least a part of the engagement protrusion is in contact with an inner wall of the engagement hole on a straight line L connecting a center of the magnetic detector and a center of the anti-rotation pin.

6 Claims, 6 Drawing Sheets

(51) Int. Cl.
  G01D 11/24 (2006.01)
  G01B 7/00 (2006.01)
  G01B 7/14 (2006.01)
  G01B 11/02 (2006.01)
  G01D 5/12 (2006.01)
  G01R 33/09 (2006.01)
  G01R 33/00 (2006.01)

(56) References Cited

U.S. PATENT DOCUMENTS

2014/0184208 A1   7/2014   Kouno et al.
2016/0123194 A1*  5/2016   Kajiura .................... F01L 1/344
                                                  123/90.15

* cited by examiner

POSITION DETECTING DEVICE

CROSS REFERENCE TO RELATED APPLICATION

This application is the U.S. national phase of International Application No. PCT/JP2016/087501 filed on Dec. 16, 2016 which designated the U.S. and claims priority to Japanese Patent Application No. 2016-009523 filed on Jan. 21, 2016, the entire contents of each of which are hereby incorporated by reference.

TECHNICAL FIELD

The present disclosure relates to a position detecting device.

BACKGROUND ART

A conventional known type of position detecting device detects a rotational position of a shaft that is included in an actuator provided for rotationally driving a valve or the like. A position detecting device described in Patent Literature 1 includes a shaft rotatably supported by a casing, a magnetic circuit unit secured to the shaft, and a magnetic detector that is secured to the casing and detects magnetic flux flowing through the magnetic circuit unit. When the shaft rotates, the position of the magnetic detector relative to the position of the magnetic circuit unit changes, and magnetic flux density passing a magnetic detecting surface of the magnetic detector changes. The magnetic detector outputs a voltage signal in accordance with the magnetic flux density passing the magnetic detecting surface. The position detecting device can detect a rotational position of the shaft by using the output of the magnetic detector.

PRIOR ART LITERATURE

Patent Literature

Patent Literature 1: JP 5720962 B

SUMMARY

If, however, the position of the magnetic detector secured on the casing is shifted in the position detecting device described in Patent Literature 1, the magnetic circuit unit and the magnetic detector may shift in position with respect to each other. The output of the magnetic detector may be affected in such cases. There is thus a demand that the casing and the magnetic detector be prevented from shifting in position with respect to each other in the position detecting device for enhanced detection accuracy.

The present disclosure has been achieved in view of the above, and an object of the present disclosure is to provide a position detecting device that enables enhanced detection accuracy.

According to an aspect of the present disclosure, a position detecting device includes a shaft, a casing, a magnetic circuit unit, a sensor, an anti-rotation hole and an anti-rotation pin. The casing supports the shaft rotatably about an axis of the shaft. The magnetic circuit unit is secured to the shaft and configured to rotate together with the shaft. The sensor is attached to the casing, and the sensor includes: a sensor body; a magnetic detector protruding from the sensor body toward the magnetic circuit unit; and at least one engagement protrusion extending from the sensor body in vicinity of the magnetic detector and engaging with an engagement hole disposed on the casing. The anti-rotation hole is disposed on one of the sensor body and the casing at a position spaced apart from the engagement hole of the casing. The anti-rotation pin is disposed on another of the sensor body and the casing, the anti-rotation pin engaging with the anti-rotation hole to prevent the casing and the sensor body from rotating relatively to each other about the engagement hole. At least a part of the at least one engagement protrusion is in contact with an inner wall of the engagement hole on a straight line connecting a center of the magnetic detector and a center of the anti-rotation pin.

In this manner, the sensor is prevented by the anti-rotation pin from rotating about the engagement hole provided on the casing and prevented by the engagement protrusion from shifting in position in a direction of the straight line connecting the center of the magnetic detector and the center of the anti-rotation pin. The magnetic detector of the sensor and the casing are thus prevented from shifting in position with respect to each other. Since the magnetic circuit unit rotates with the shaft, which is supported by the casing, the magnetic detector and the magnetic circuit unit are prevented from shifting in position with respect to each other. The position detecting device can thus detect a rotary angle of the shaft accurately.

DESCRIPTION OF EMBODIMENTS

An embodiment of the present disclosure is described below with reference to the drawings. A position detecting device according to the embodiment of the present disclosure is illustrated in FIGS. 1 to 7. A position detecting device 1 detects a rotational position of a shaft 2 that is included in an actuator that rotationally drives, for example, a waste gate valve, a throttle valve, or the like in a vehicle.

Figure 1:
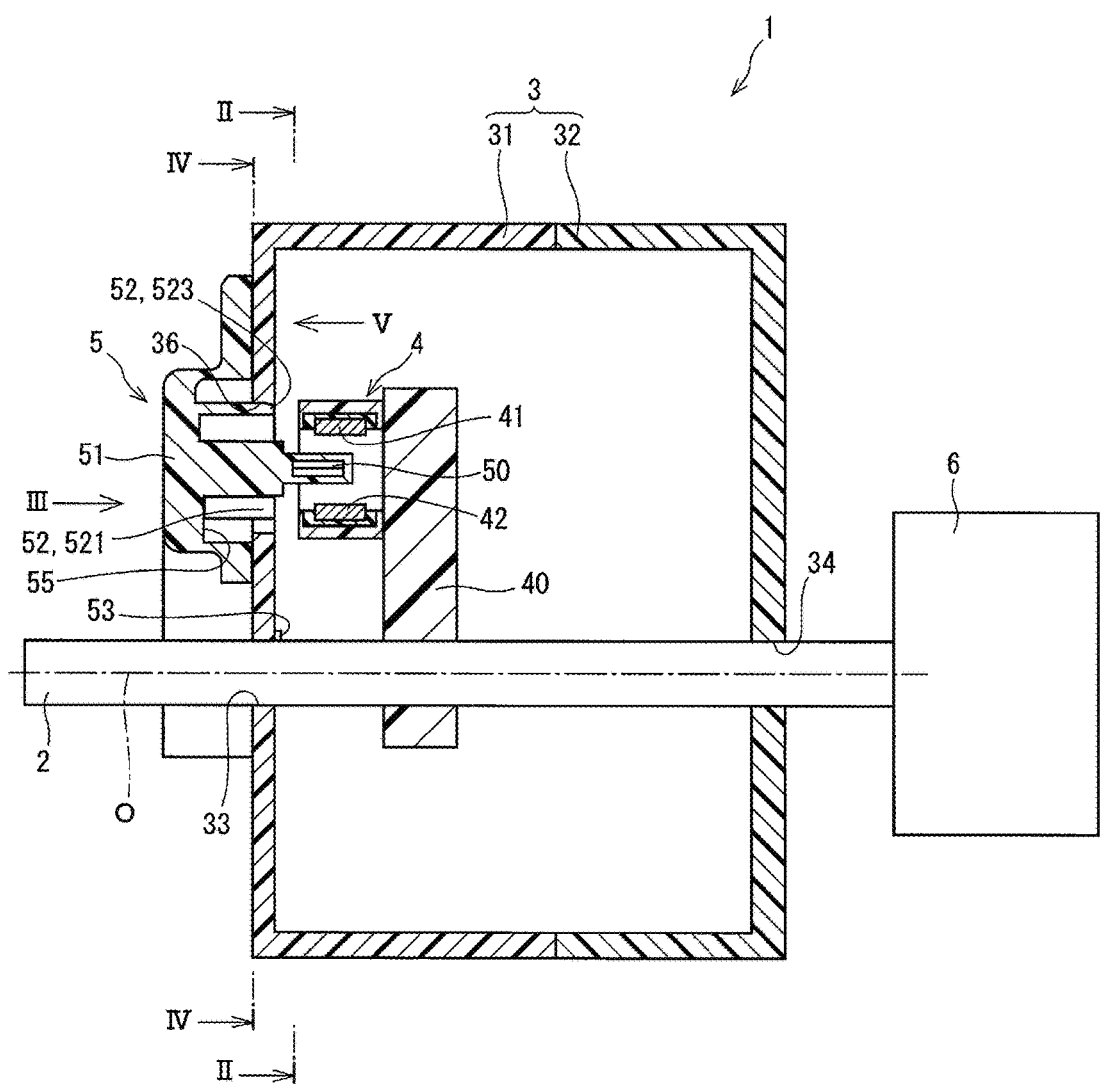
FIG. 1 is a sectional view of a position detecting device according to an embodiment of the present disclosure.

As illustrated in FIG. 1, the position detecting device 1 includes the shaft 2, a casing 3, a magnetic circuit unit 4, and a sensor 5.

The shaft 2 is coupled to a motor 6 or the like and is rotatable about a rotation axis O. The casing 3 includes a first case 31 and a second case 32. The first and second cases 31 and 32 have shaft holes 33 and 34 through which the shaft passes, respectively. The shaft 2 passes through the shaft holes 33 and 34 and is supported by the casing 3 rotatably. The shaft 2 is rotatable in a predefined range that is limited in a circumferential direction.

Figure 2:
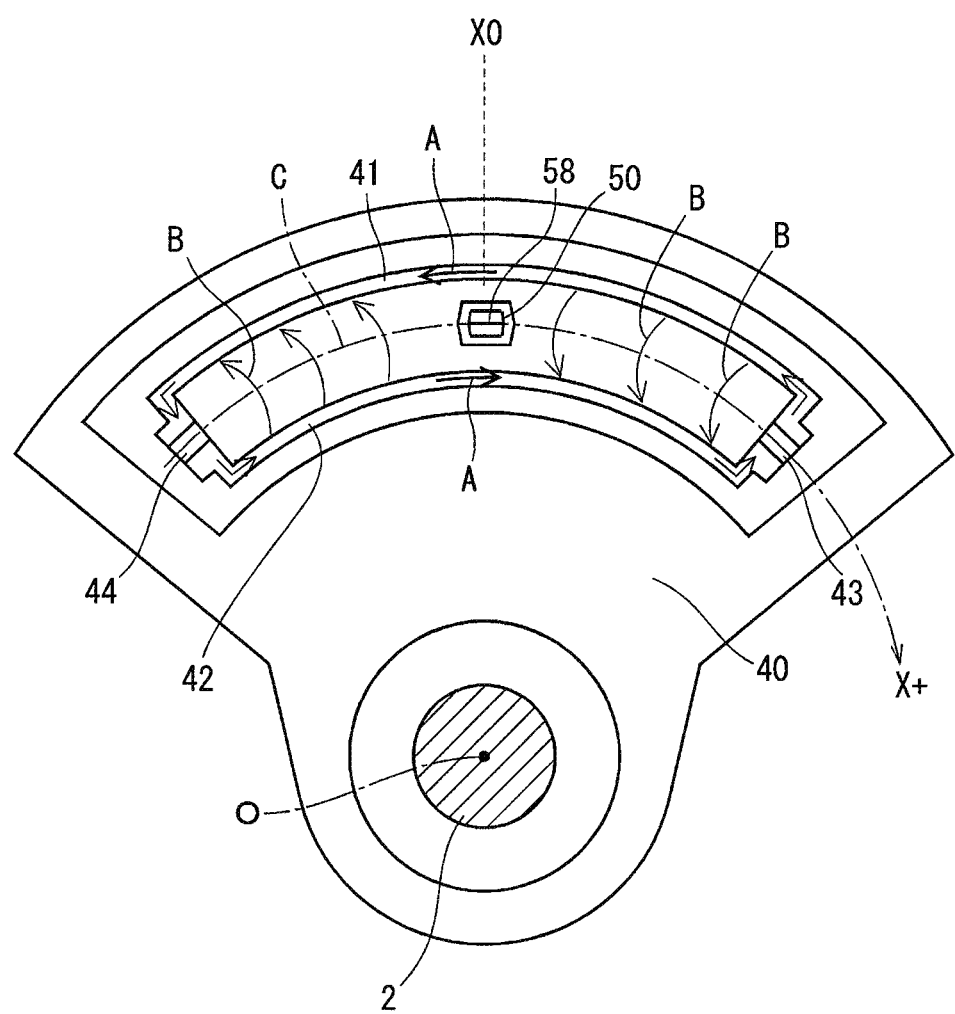
FIG. 2 is a sectional view taken along line II-II in FIG. 1.

As illustrated in FIGS. 1 and 2, the magnetic circuit unit 4 includes a rotary table 40, which is secured to the shaft 2 and has a fan-like shape, a first yoke 41, a second yoke 42, a first magnet 43, and a second magnet 44, which are secured to the rotary table 40. The magnetic circuit unit 4 is thus secured to the shaft 2 and rotates together with the shaft 2. Illustration of the casing 3 is omitted in FIG. 2.

The first magnet 43 and the second magnet 44 are disposed in a rotational direction of the shaft 2 and are spaced apart from each other. A magnetic field produced by the first magnet 43 and that by the second magnet 44 have the same strength.

The first yoke 41 and the second yoke 42 face each other, extending in parallel with each other in arc shapes that extend about the rotation axis O of the shaft 2. The first yoke 41 and the second yoke 42 are each made by using a magnetic body.

The first yoke 41 has one end that is coupled to an N-pole of the first magnet 43 and another end that is coupled to an S-pole of the second magnet 44. The second yoke 42 has one end that is coupled to an S-pole of the first magnet 43 and another end that is coupled to an N-pole of the second magnet 44. The first magnet 43, the second magnet 44, the first yoke 41, and the second yoke 42 configure a magnetic circuit in this manner.

Magnetic flux that flows through the magnetic circuit unit 4 includes main flux that flows as indicated by arrows marked with a symbol A in FIG. 2 from the N-pole of the first magnet 43 via the first yoke 41 to the S-pole of the second magnet 44 and from the N-pole of the second magnet 44 via the second yoke 42 to the S-pole of the first magnet 43. The magnetic flux that flows through the magnetic circuit unit 4 includes leakage flux that flows as indicated by arrows marked with a symbol B between the first yoke 41 and the second yoke 42. In FIG. 2, some of the arrows that schematically represent the main magnetic flux are marked with the symbol A, and some of the arrows that schematically represent the leakage flux are marked with the symbol B.

A magnetic detector 50, which is included in the sensor 5, is located between the first yoke 41 and the second yoke 42. When the shaft 2 and the magnetic circuit unit 4 rotate together, the magnetic detector 50 moves relatively to the magnetic circuit unit 4 on a path represented by a dot and dash line C in FIG. 2.

As illustrated in FIGS. 1 and 3 to 6, the sensor 5 is made by injection-molding resin to integrally include the magnetic detector 50, a sensor body 51, an engagement protrusion 52, an anti-rotation pin 53, and a connector 54.

Figure 4:
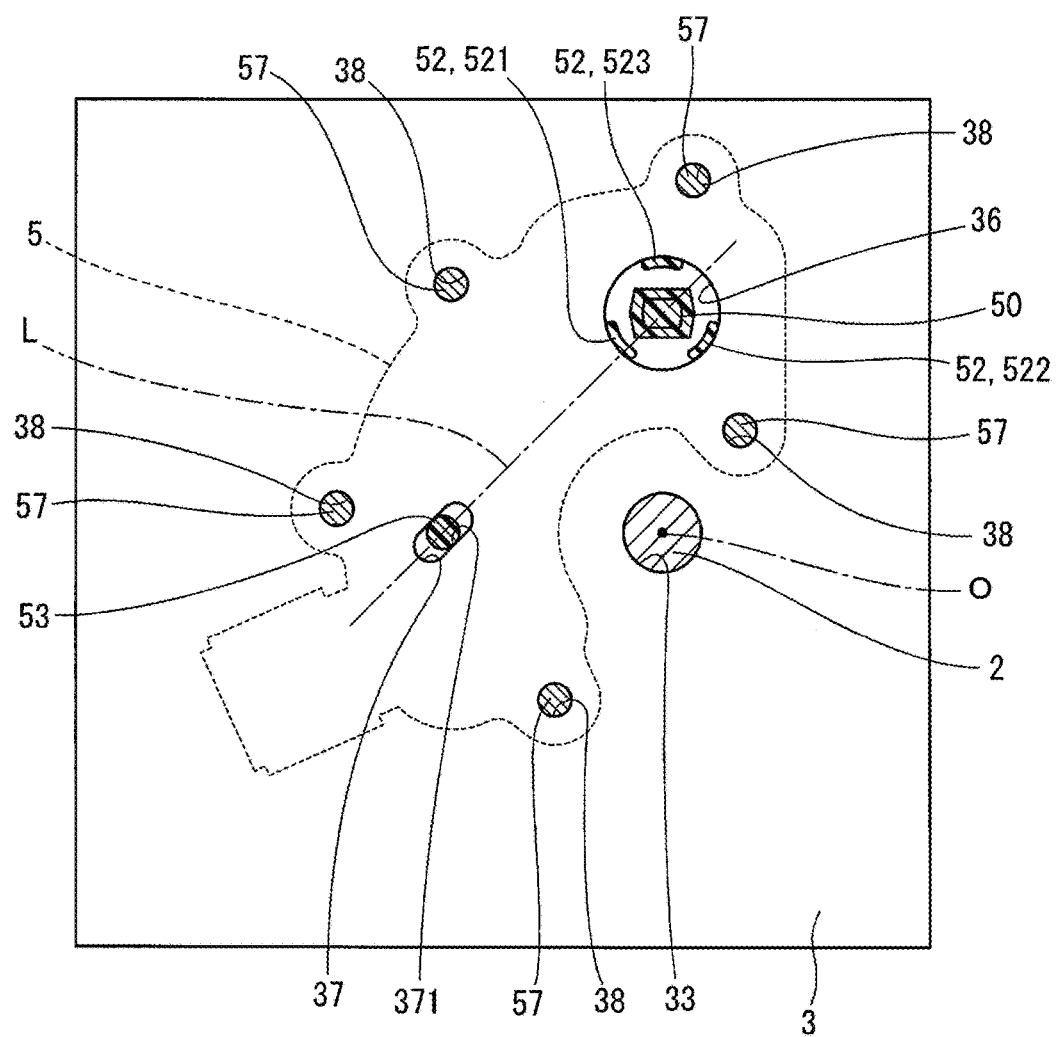
FIG. 4 is a sectional view taken along line IV-IV in FIG. 1.
Figure 5:
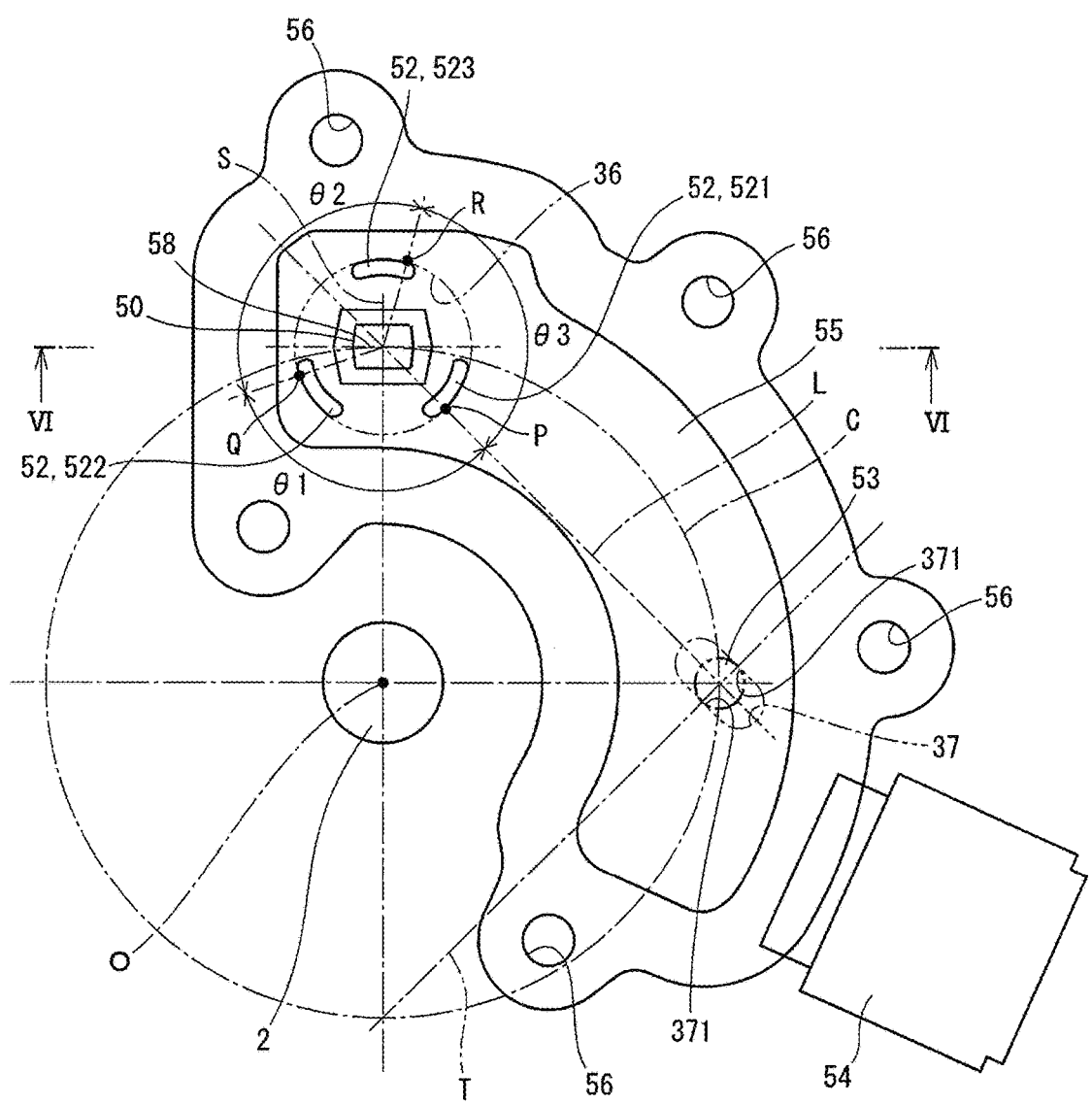
FIG. 5 is a view of the sensor observed from direction V in FIG. 1, with a casing excluded.

FIG. 4 is a sectional view taken along line IV-IV in FIG. 1; an installation position of the sensor 5 on the casing 3 is indicated by a dot and dash line. FIG. 5 is a diagram that illustrates the sensor 5 and the shaft 2 only, excluding the casing 3 and the magnetic circuit unit 4, as viewed in direction V in FIG. 1. In FIG. 5, positions of an engagement hole 36 and an anti-rotation hole 37, which are disposed in the casing 3, are indicated by chain double dashed lines.

Figure 3:
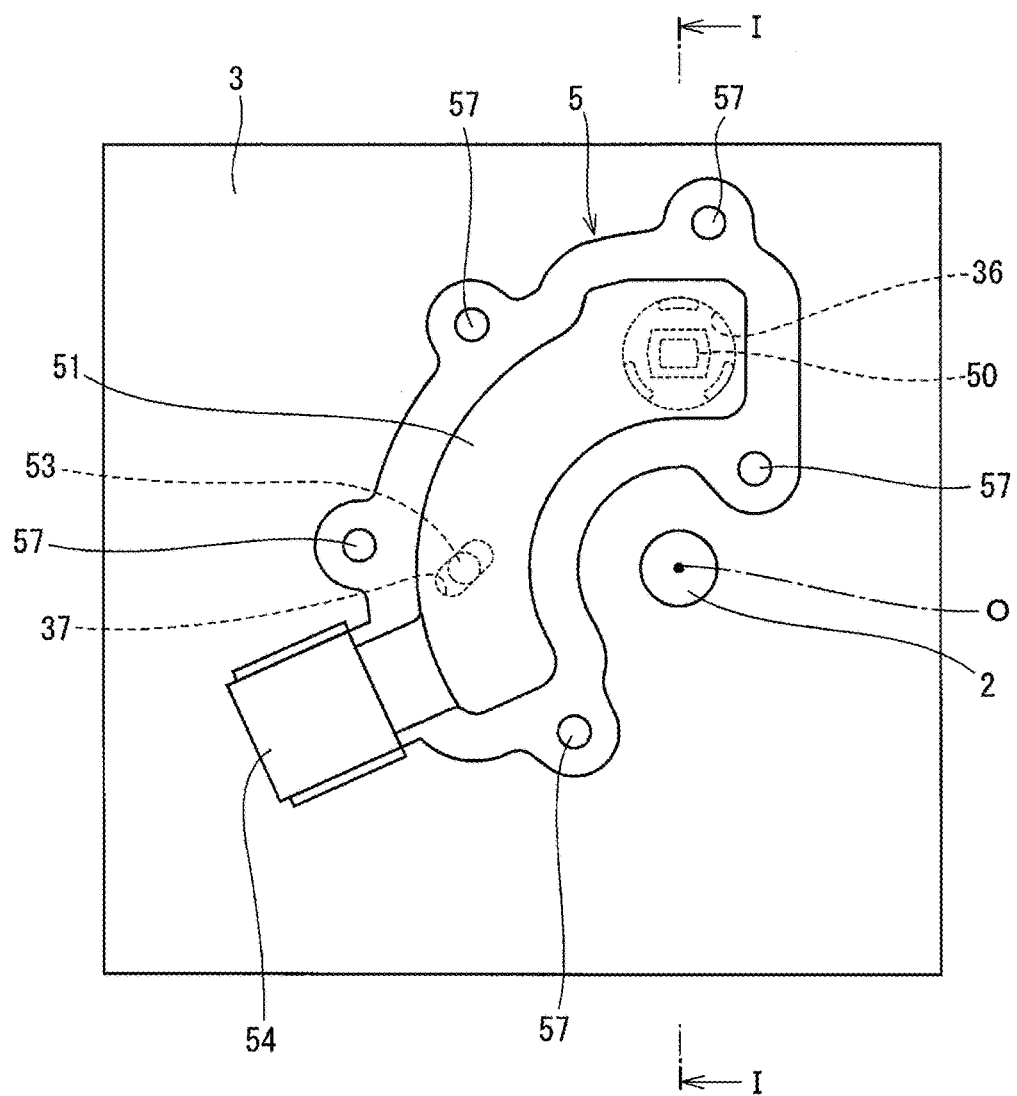
FIG. 3 is a view of a sensor observed from direction III in FIG. 1.

As illustrated in FIGS. 3 and 4, the sensor body 51 has a substantially arc shape extending about the rotation axis O of the shaft 2. The sensor body 51 has a plurality of holes 56 that passes through an edge portion of the sensor body 51 in a thickness direction of the sensor body 51. The sensor body 51 is attached to the casing 3 using a screw 57 that passes through one of the holes 56 provided in the edge portion and engages with a screw hole 38 provided in the casing 3. When the sensor body 51 is attached to the casing 3, the magnetic detector 50 passes through the engagement hole 36 disposed in the casing 3, the engagement protrusion 52 engages with the engagement hole 36, and the anti-rotation pin 53 engages with the anti-rotation hole 37 disposed in the casing 3.

Figure 6:
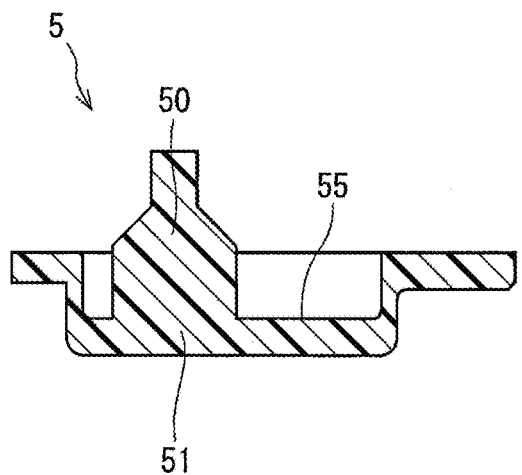
FIG. 6 is a sectional view taken along line VI-VI in FIG. 5.

As illustrated in FIGS. 1 and 6, the sensor body 51 has a recess portion 55 that extends in the thickness direction of the sensor body 51 from the casing 3 side. As illustrated in FIGS. 1 and 2, the magnetic detector 50 protrudes from the recess portion 55 of the sensor body 51 toward the magnetic circuit unit 4. The magnetic detector 50 is inserted between the first yoke 41 and the second yoke 42 of the magnetic circuit unit 4. The magnetic detector 50 is made by, for example, molding two Hall ICs together with the resin that forms the sensor body 51. The two Hall ICs have magnetic detecting surfaces that are significantly in parallel with a plane 58 (see FIGS. 2 and 5) that is perpendicular to a radial direction of the shaft 2 in which the first yoke 41 and the second yoke 42 face each other. The magnetic detector 50 outputs a voltage signal in accordance with a magnetic flux density passing the magnetic detecting surfaces of the Hall ICs.

Figure 7:
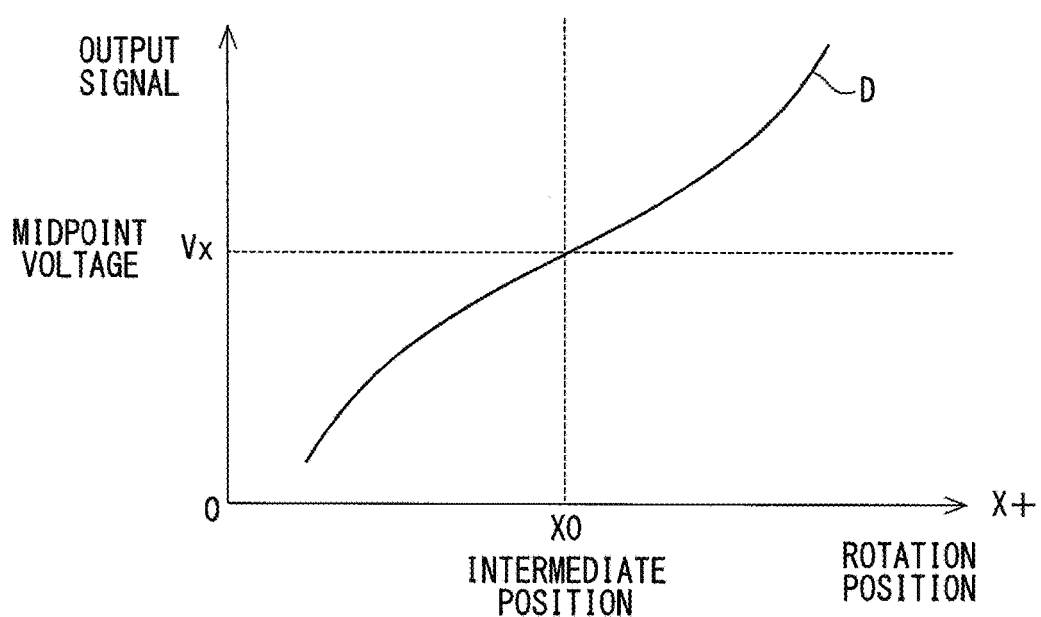
FIG. 7 is a graph of an output characteristic of the position detecting device.

FIG. 7 is a graph of an output characteristic of the magnetic detector 50. When the shaft 2 rotates and the magnetic circuit unit 4 moves relatively to the magnetic detector 50, the magnetic detector 50 outputs a voltage signal indicated with a solid line D. A voltage signal output by the magnetic detector 50 increases, for example, as the magnetic detector 50 approaches the first magnet 43 and decreases as the magnetic detector 50 approaches the second magnet 44. The voltage signal has point symmetry about a midpoint voltage Vx. The midpoint voltage Vx is output by the magnetic detector 50 when the magnetic detector 50 is at an intermediate position X0 (see FIG. 2) between the first magnet 43 and the second magnet 44.

A shift in position of the magnetic detector 50 and the magnetic circuit unit 4 with respect to each other may affect an output signal from the magnetic detector 50 illustrated in FIG. 7.

As illustrated in FIGS. 1, 4 and 5, the engagement protrusion 52 extends from the recess portion 55, which is disposed in the sensor body 51 around the magnetic detector 50, toward the magnetic circuit unit 4 and engages with the engagement hole 36 disposed in the casing 3. The engagement protrusion 52 is in contact with an inner wall of the engagement hole 36 at a plurality of locations on a circumference of a circle centered on the magnetic detector 50.

In the present embodiment, the engagement protrusion 52 includes three engagement protrusions that are disposed on a circumference of a circle centered on the magnetic detector 50. In the description below, the three engagement protrusions of the engagement protrusion 52 may be referred to as a first engagement protrusion 521, a second engagement protrusion 522, and a third engagement protrusion 523, as required.

As illustrated in FIG. 5, at least a part of the engagement protrusion 52 is in contact with the inner wall of the engagement hole 36 on a straight line connecting a center of the magnetic detector 50 and a center of the anti-rotation pin 53. In the description below, the straight line connecting the center of the magnetic detector 50 and the center of the anti-rotation pin 53 is referred to as "straight line L."

In FIG. 5, a location where the first engagement protrusion 521 is in contact with the inner wall of the engagement hole 36 on the straight line L is marked with a symbol P. The engagement protrusion 52 is in contact with the inner wall of the engagement hole 36 on the circumference of the circle centered on the magnetic detector 50 at intervals of 120° or less in a circumferential direction about the magnetic detector 50 from a starting point at the location of the contact marked with the symbol P. In FIG. 5, a location where the second engagement protrusion 522 is in contact with the inner wall of the engagement hole 36 is marked with a symbol Q, and a location where the third engagement protrusion 523 is in contact with the inner wall of the engagement hole 36 is marked with a symbol R. In the present embodiment, angles θ1, θ2, and θ3 formed by lines connecting the center of the magnetic detector 50 and symbols P, Q, and R are each 120°.

The three engagement protrusions of the engagement protrusion 52 are disposed so as to be symmetric with respect to a plane S that is perpendicular to the magnetic detecting surfaces of the magnetic detector 50. Specifically, the first engagement protrusion 521 and the second engagement protrusion 522 are disposed so as to be symmetric with respect to the plane S, and the third engagement protrusion 523 has plane symmetry with respect to a center of the third engagement protrusion 523.

The anti-rotation hole 37 in the casing 3 is spaced apart from the engagement hole 36. The anti-rotation hole 37 has an elongated hole shape having its lengthwise direction in parallel with the straight line L. The anti-rotation hole 37 has an inner wall 371 in a widthwise direction that is orthogonal to the straight line L. The inner wall 371 is in contact with the anti-rotation pin 53.

The anti-rotation pin 53 has a cylindrical shape and protrudes from the recess portion 55 of the sensor body 51. The anti-rotation pin 53 is disposed in a position that corresponds to that of the anti-rotation hole 37. The anti-rotation pin 53 engages with the anti-rotation hole 37 to inhibit the casing 3 and the sensor 5 from rotating relatively to each other about the engagement hole 36.

In FIG. 5, a relative rotating path of the center of the magnetic detector 50 with respect to the magnetic circuit unit 4 is marked with a dot and dash line C. In the present embodiment, the anti-rotation pin 53 is disposed on the relative rotating path of the center of the magnetic detector 50 with respect to the magnetic circuit unit 4. That is, the anti-rotation pin 53 is disposed in a position that allows a distance from the center of the anti-rotation pin 53 to the rotation axis O of the shaft 2 to be equal to or greater than a distance from the center of the magnetic detector 50 to the rotation axis O of the shaft 2. Additionally, a straight line connecting the center of the magnetic detector 50 and the rotation axis O of the shaft 2 and a straight line connecting the center of the anti-rotation pin 53 and the rotation axis O of the shaft 2 form an angle of 90° or greater. In this manner, a distance from the magnetic detector 50 to the anti-rotation pin 53 can be increased. The sensor 5 and the casing 3 can be thus inhibited from shifting in position with respect to each other.

The connector 54 is disposed on the sensor body 51 in a position on an opposite side of a plane T from the magnetic detector 50. The plane T is perpendicular to the straight line L and includes the center of the anti-rotation pin 53. That is, the anti-rotation pin 53 is disposed between the connector 54 and the magnetic detector 50. The anti-rotation pin 53 can prevent a vibration transmitted from the connector 54 to the sensor body 51 from being transmitted to the magnetic detector 50.

The connector 54 is connected to a harness (not shown). When electric power is supplied from the harness to the sensor 5, the sensor 5 outputs a voltage signal in accordance with the rotational position of the shaft 2. The voltage signal is transmitted to an electronic control unit (ECU) (not shown) via the harness. The ECU detects the rotational position of the shaft 2 on the basis of the voltage signal.

The position detecting device 1 according to the present embodiment has operational advantages described below.

(1) In the present embodiment, the sensor 5 is prevented by the anti-rotation pin 53 from rotating about the engagement hole 36 disposed in the casing 3 and prevented by the first engagement protrusion 521, which is in contact with the inner wall of the engagement hole 36 on the straight line L, from shifting in position in a direction of the straight line L. The magnetic detector 50 of the sensor 5 and the casing 3 are thus prevented from shifting in position with respect to each other. Since the magnetic circuit unit 4 rotates with the shaft 2, which is supported by the casing 3, the magnetic detector 50 and the magnetic circuit unit 4 are prevented from shifting in position with respect to each other. The position detecting device 1 can thus detect a rotary angle of the shaft 2 accurately.

(2) In the present embodiment, the engagement protrusion 52 is in contact with the inner wall of the engagement hole 36 at a plurality of locations on a circumference of a circle centered on the magnetic detector 50.

A portion of a metal mold is located between the magnetic detector 50 and the engagement protrusion 52 during the injection molding in which the sensor 5, the magnetic detector 50, and the engagement protrusion 52 are formed integrally. The configuration of the engagement protrusion 52 can prevent the portion of the metal mold from reducing in thickness for the entire circumference of the magnetic detector 50. The engagement protrusion 52 according to the present embodiment can prolong the life of the metal mold used for the injection molding in comparison with an engagement protrusion having a tubular shape.

(3) In the present embodiment, the first engagement protrusion 521 is in contact with the inner wall of the engagement hole 36 on the straight line L. The second engagement protrusion 522 and the third engagement protrusion 523 are in contact with the inner wall of the engagement hole 36 at intervals of 120° or less in the circumferential direction about the magnetic detector 50 from a starting point where the first engagement protrusion 521 is in contact with the inner wall of the engagement hole 36.

The engagement protrusion 52 is thus in contact with the inner wall of the engagement hole 36 at three or more locations in this manner. The engagement protrusion 52 thus produces an engagement force of a magnitude equivalent to that of an engagement protrusion having a tubular shape. That is, the engagement protrusion 52 can prevent the magnetic detector 50 from shifting in position and tilting in all radial directions from the engagement hole 36 and prevent the casing 3 and the sensor 5 from moving relatively to each other in all the radial directions.

(4) In the present embodiment, the anti-rotation hole 37 has an elongated hole shape having its lengthwise direction parallel to the straight line L. The inner wall 371 of the anti-rotation hole 37 faces and contacts the anti-rotation pin 53 in the widthwise direction.

The position detecting device 1 has the anti-rotation hole 37, which is an elongated hole and thereby enables the inner wall 371 of the anti-rotation hole 37 facing in the widthwise direction to be in contact with the anti-rotation pin 53 reliably and can facilitate installation of the anti-rotation pin 53 to the anti-rotation hole 37.

Since the inner wall 371 of the anti-rotation hole 37 facing in the widthwise direction is in contact with anti-rotation pin 53 reliably, the position detecting device 1 can inhibit the casing 3 and the sensor body 51 from rotating relatively to each other about the engagement hole 36.

(5) In the present embodiment, the engagement protrusion 52 is disposed so as to be symmetric with respect to the plane S, which is perpendicular to the magnetic detecting surfaces of the magnetic detector 50.

The magnetic detector 50 can thus be inhibited from shifting in position and tilting with respect to the casing 3 reliably.

(6) In the present embodiment, the connector 54, which is included in the sensor 5, is disposed in a position on an opposite side of the plane T from the magnetic detector 50. The plane T is perpendicular to the straight line L and includes the center of the anti-rotation pin 53.

Since the anti-rotation pin 53 is disposed between the connector 54 and the magnetic detector 50, a vibration transmitted to the sensor body 51 from a harness that is connected to the connector 54 is prevented from being transmitted to the magnetic detector 50. The position detecting device 1 can thus prevent the magnetic detector 50 from shifting in position and thereby detect the rotary angle of the shaft 2 accurately.

In the embodiment described above, the engagement protrusion 52 is segmented into three pieces that each has an arc shape. In another embodiment, the engagement protrusion 52 may be unsegmented and have a tubular shape. In this case, the engagement protrusion 52 may be in contact with the inner wall of the engagement hole 36 over the entire circumference.

In another embodiment, the engagement protrusion 52 may be segmented into two pieces, or into three or more pieces.

In the embodiment described above, the anti-rotation hole 37 has an elongated hole shape. In another embodiment, the anti-rotation hole 37 may have a circular shape or a polygonal shape.

In the embodiment described above, the anti-rotation pin 53 is disposed on the sensor 5 and the anti-rotation hole 37 is disposed in the casing 3. In another embodiment, the anti-rotation hole 37 may be disposed in the sensor 5 and the anti-rotation pin 53 may be disposed on the casing 3.

In the embodiment described above, the magnetic detector 50 includes two Hall ICs. In another embodiment, the magnetic detector 50 may include one Hall IC or three or more Hall ICs. The magnetic detector 50 may include a magnetoresistive sensor or the like.

The present disclosure is not limited to the embodiments described above, and various modifications are possible within the scope of the present disclosure without departing from the spirit of the invention.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

The invention claimed is:

1. A position detecting device comprising:
a shaft;
a casing supporting the shaft rotatably about an axis of the shaft;
a magnetic circuit unit secured to the shaft and configured to rotate together with the shaft;
a sensor attached to the casing, the sensor including:
a sensor body;
a magnetic detector protruding from the sensor body toward the magnetic circuit unit; and
at least one engagement protrusion extending from the sensor body in vicinity of the magnetic detector and engaging with an engagement hole disposed on the casing,
an anti-rotation hole disposed on one of the sensor body and the casing at a position spaced apart from the engagement hole of the casing; and
an anti-rotation pin disposed on another of the sensor body and the casing, the anti-rotation pin engaging with the anti-rotation hole to prevent the casing and the sensor body from rotating relatively to each other about the engagement hole, wherein
at least a part of the at least one engagement protrusion is in contact with an inner wall of the engagement hole on a straight line connecting a center of the magnetic detector and a center of the anti-rotation pin.

2. The position detecting device according to claim 1, wherein the at least one engagement protrusion is in contact with the inner wall of the engagement hole at a plurality of locations on a circumference of a circle centered on the magnetic detector.

3. The position detecting device according to claim 1, wherein:
the at least one engagement protrusion includes more than three engagement protrusions that are disposed on a circumference of a circle centered on the magnetic detector;
predefined one of the engagement protrusions is in contact with the inner wall of the engagement hole on the straight line connecting the center of the magnetic detector and the center of the anti-rotation pin; and
other ones of the engagement protrusions are in contact with the inner wall of the engagement hole at intervals of 120° or less in a circumferential direction from a starting point where the predefined one of the engagement protrusions is in contact with the inner wall of the engagement hole on the straight line connecting the center of the magnetic detector and the center of the anti-rotation pin.

4. The position detecting device according to claim 1, wherein the anti-rotation hole has an elongated hole shape so that a lengthwise direction of the anti-rotation hole is parallel to the straight line connecting the center of the magnetic detector and the center of the anti-rotation pin, and the anti-rotation hole has an inner wall facing and contacting the anti-rotation pin in a widthwise direction orthogonal to the straight line.

5. The position detecting device according to claim 1, wherein the at least one engagement protrusion is symmetric with respect to a plane that is perpendicular to a magnetic detecting surface of the magnetic detector.

6. The position detecting device according to claim 1, wherein the sensor includes a connector that is disposed on the sensor body at a position on a side of a plane facing away from the magnetic detector, the plane being perpendicular to the straight line connecting the center of the magnetic detector and the center of the anti-rotation pin and including the center of the anti-rotation pin.

* * * * *